United States Patent
Sommer et al.

(10) Patent No.: US 10,084,481 B2
(45) Date of Patent: Sep. 25, 2018

(54) GLDPC SOFT DECODING WITH HARD DECISION INPUTS

(71) Applicant: APPLE INC., Cupertino, CA (US)

(72) Inventors: Naftali Sommer, Rishon Lezion (IL); Moti Teitel, Tel Aviv (IL); Micha Anholt, Tel Aviv (IL)

(73) Assignee: APPLE INC., Cupertino, CA (US)

(*) Notice: Subject to any disclaimer, the term of this patent is extended or adjusted under 35 U.S.C. 154(b) by 370 days.

(21) Appl. No.: 14/574,411

(22) Filed: Dec. 18, 2014

(65) Prior Publication Data
US 2016/0182087 A1    Jun. 23, 2016

(51) Int. Cl.
| H03M 13/00 | (2006.01) |
| H03M 13/11 | (2006.01) |
| H03M 13/29 | (2006.01) |
| H03M 13/37 | (2006.01) |
| H03M 13/45 | (2006.01) |

(52) U.S. Cl.
CPC .... *H03M 13/1148* (2013.01); *H03M 13/1128* (2013.01); *H03M 13/1142* (2013.01); *H03M 13/1174* (2013.01); *H03M 13/2963* (2013.01); *H03M 13/2975* (2013.01); *H03M 13/3715* (2013.01); *H03M 13/453* (2013.01)

(58) Field of Classification Search
CPC ............. H03M 13/2957; H03M 13/45; H03M 13/1111; H03M 13/1102; H04L 1/0045
USPC ........................................................ 714/780
See application file for complete search history.

(56) References Cited

U.S. PATENT DOCUMENTS

| 4,414,623 A | 11/1983 | Davis et al. |
| 4,845,713 A | 7/1989 | Zook |
| 5,267,242 A | 11/1993 | Levalee et al. |

(Continued)

FOREIGN PATENT DOCUMENTS

| EP | 2675069 A1 * | 12/2013 | ........ H03M 13/3761 |
| WO | 2007052991 A1 | 5/2007 | |

(Continued)

OTHER PUBLICATIONS

Zhou et al., "Low-Complexity High-Rate Reed-Salomon Block Turbo Codes", IEEE Transactions on Communications, vol. 55 ,Issue 9, pp. 1656-1660, Sep. 2007.

(Continued)

*Primary Examiner* — Albert Decady
*Assistant Examiner* — Enam Ahmed
(74) *Attorney, Agent, or Firm* — D. Kligler IP Services Ltd.

(57) ABSTRACT

A decoder includes circuitry and a soft decoder. The circuitry is configured to receive channel hard decisions for respective bits of a Generalized Low-Density Parity Check (GLDPC) code word that includes multiple component code words, including first and second component code words having one or more shared bits, to schedule decoding of the GLDPC code word, and following the decoding, to output the decoded GLDPC code word. The soft decoder is configured to receive the channel hard decisions corresponding to the first component code word, to further receive soft reliability measures that were assigned to the shared bits in decoding the second component code word, and to decode the first component code word based on the channel hard decisions and the soft reliability measures.

20 Claims, 4 Drawing Sheets

(56) References Cited

U.S. PATENT DOCUMENTS

| | | | |
|---|---|---|---|
| 5,828,676 A * | 10/1998 | Hurlbut | H03M 13/096 375/329 |
| 6,047,395 A | 4/2000 | Zook | |
| 6,353,909 B1 | 3/2002 | Amrany et al. | |
| 6,385,751 B1 | 5/2002 | Wolf | |
| 6,631,488 B1 | 10/2003 | Stambaugh et al. | |
| 6,938,196 B2 | 8/2005 | Richardson et al. | |
| 6,982,659 B2 | 1/2006 | Shen et al. | |
| 7,114,086 B2 | 9/2006 | Mizuyabu et al. | |
| 7,184,351 B2 | 2/2007 | Ito et al. | |
| 7,184,352 B2 | 2/2007 | Klein et al. | |
| 7,475,103 B2 | 1/2009 | Novichkov et al. | |
| 7,478,310 B2 | 1/2009 | Jung et al. | |
| 7,770,090 B1 * | 8/2010 | Kons | H03M 13/1137 714/780 |
| 7,783,905 B2 | 8/2010 | Chang et al. | |
| 7,930,621 B2 | 4/2011 | Zhong | |
| 8,139,426 B2 | 3/2012 | Park et al. | |
| 8,327,242 B1 | 12/2012 | Anholt et al. | |
| 8,429,498 B1 | 4/2013 | Anholt et al. | |
| 8,453,038 B2 | 5/2013 | Anholt | |
| 8,549,382 B2 | 10/2013 | Motwani | |
| 8,601,352 B1 | 12/2013 | Anholt et al. | |
| 8,812,939 B2 | 8/2014 | Yang et al. | |
| 8,832,534 B1 * | 9/2014 | Dave | H03M 13/1111 714/758 |
| 9,337,866 B2 * | 5/2016 | Gasanov | H03M 13/1111 |
| 2004/0019842 A1 * | 1/2004 | Argon | H03M 13/29 714/755 |
| 2006/0214820 A1 | 9/2006 | Kleihorst et al. | |
| 2007/0013816 A1 | 1/2007 | Martin | |
| 2007/0198895 A1 | 8/2007 | Paumier et al. | |
| 2008/0052594 A1 * | 2/2008 | Yedidia | H03M 13/1105 714/758 |
| 2008/0072122 A1 * | 3/2008 | Nimbalker | H03M 13/114 714/774 |
| 2008/0172592 A1 | 7/2008 | Wehn et al. | |
| 2008/0198650 A1 | 8/2008 | Shalvi et al. | |
| 2008/0244367 A1 * | 10/2008 | Chin | G06F 12/0246 714/800 |
| 2009/0024905 A1 | 1/2009 | Shalvi et al. | |
| 2009/0070659 A1 | 3/2009 | Zhong et al. | |
| 2009/0077449 A1 | 3/2009 | Lee | |
| 2009/0094470 A1 | 4/2009 | Gao et al. | |
| 2009/0106485 A1 | 4/2009 | Anholt | |
| 2009/0187803 A1 | 7/2009 | Anholt et al. | |
| 2009/0199065 A1 * | 8/2009 | Djordjevic | H03M 13/1174 714/752 |
| 2009/0199074 A1 | 8/2009 | Sommer | |
| 2009/0249159 A1 | 10/2009 | Lee et al. | |
| 2009/0282320 A1 | 11/2009 | Liao et al. | |
| 2010/0306626 A1 | 12/2010 | Keays et al. | |
| 2011/0107188 A1 | 5/2011 | Dror et al. | |
| 2011/0214039 A1 * | 9/2011 | Steiner | G06F 11/1012 714/797 |
| 2012/0054576 A1 * | 3/2012 | Gross | H03M 13/1117 714/752 |
| 2012/0240007 A1 | 9/2012 | Barndt et al. | |
| 2013/0145231 A1 | 6/2013 | Frayer et al. | |
| 2013/0179748 A1 | 7/2013 | Dong et al. | |
| 2014/0040531 A1 | 2/2014 | Wu et al. | |
| 2014/0122975 A1 | 5/2014 | Patapoutian et al. | |
| 2014/0208182 A1 | 7/2014 | Sakai et al. | |
| 2014/0258809 A1 | 9/2014 | Nguyen et al. | |
| 2015/0106680 A1 * | 4/2015 | Djordjevic | H03M 13/1174 714/776 |

FOREIGN PATENT DOCUMENTS

| | | | |
|---|---|---|---|
| WO | 2007132453 A2 | 11/2007 | |
| WO | 2007132457 A2 | 11/2007 | |
| WO | 2008026203 A2 | 3/2008 | |
| WO | 2008053472 A2 | 5/2008 | |
| WO | 2008139441 A2 | 11/2008 | |
| WO | 2009053961 A2 | 4/2009 | |
| WO | 2009072103 A2 | 6/2009 | |
| WO | 2009072105 A2 | 6/2009 | |
| WO | 2009074979 A2 | 6/2009 | |

OTHER PUBLICATIONS

Hirst et al., "Application of efficient Chase algorithm in decoding of generalized low-density parity-check codes", IEEE Communications Letters, vol. 6, Issue 9, pp. 385-387, Sep. 2002.

International Application # PCT/US15/56298 Search Report dated Jan. 5, 2016.

Chase, D., "A Class of Algorithms for Decoding Block Codes with Channel Measurement Information", IEEE Transactions on Information Theory, vol. IT-18, No. 1, pp. 170-182, Jan. 1972.

Blahut, R.E., "Theory and Practice of Error Control Codes", chapter 6, sections 6.1-6.3, pp. 130-140, Addison-Wesley Publishing Company, Inc., USA, 1983.

Blahut, R.E., "Algebraic Codes for Data Transmission", chapter 6, pp. 131-166, and chapter 7, pp. 179-190, 217-233, Cambridge University Press, UK, 2004.

Chien, R.T., "Cyclic Decoding Procedures for Bose-Chaudhuri-Hocquenghem Codes", IEEE Transactions on Information Theory, vol. IT-10, pp. 357-363, Oct. 1964.

Lin et al., "Error control coding fundamentals and applications", chapter 6, pp. 209-215; chapter 7, pp. 241-255; chapter 17.6, pp. 871-880, 2nd edition, Pearson Education, Inc., USA, 2004.

Forney, D. G., "Generalized Minimum Distance Decoding", IEEE Transactions on Information Theory, vol. IT-12, No. 2, pp. 125-131, Apr. 1966.

Gallager, R.G., "Low-Density Panty-Check Codes", Cambridge, USA, 90 pages, Jul. 1963.

Bez et al.,"Introduction to Flash memory", Proceedings of the IEEE, vol. 91, No. 4, pp. 489-502, Apr. 2003.

Eitan et al., "Multilevel Flash Cells and their Trade-Offs", Proceedings of the 1996 IEEE International Electron Devices Meeting (IEDM), pp. 169-172, New York, USA 1996.

Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.

Maayan et al., "A 512 Mb NROM Flash Data Storage Memory with 8 MB/s Data Rate", Proceedings of the 2002 IEEE International Solid-Stale circuits Conference (ISSCC 2002), pp. 100-101, San Francisco, USA, Feb. 3-7, 2002.

Kim et al., "Future Memory Technology includind Emerging New Memories" Proceedings of the 24th International Conference on Microelectronics (MIEL), vol. 1, pp. 377-384, Nis, Serbia and Montenegro, May 16-19, 2004.

Gallager, R.G., "Low-Density Parity-Check Codes", IRE Transactions on Information Theory, pp. 21-28, Jan. 1962.

Wu et al., "Parallel Weighted Bit-Flippin Decoding", IEEE Communication Letters, vol. 11, No. 8, pp. 671-673, Aug. 2007.

Sharon et al., "Efficient Serial Message-Passing Schedules for LDPC Decoding" IEEE Transactions on Information Theory, vol. 53, No. 11, pp. 4076-4091, Nov. 2007.

Blahut, R., "Algebraic Codes for Data Transmission", Chapter 3.6, pp. 62-63, Cambridge University Press 2003.

Chen et al., "Small Area Parallel Chien Search Architectures for Long BCH Codes", IEEE Transactions on Very Large Scale Integration (VLSI) Systems, vol. 12, No. 5, pp. 656-549, May 2004.

Ha et al., "Rate-Compatible Punctured Low Density Parity Check Codes with Short Block Lengths", IEEE Transactions on Information Theory, vol. 52, No. 2, pp. 728-738, Feb. 2006.

Han et al., "An Efficient Dynamic Schedule for Layered Belief-Propagation Decoding of LDPC Codes", IEEE Communication Letters, vol. 13, No. 12, pp. 950-952, Dec. 2009.

IEEE Standard 802.11n-2009 "IEEE Standard for Information Technology—Telecommunications and Information Exchange Between Systems—Local and Metropolitan Area Networks—Specific Requirements Part 11: Wireless LAN Medium Access Control (MAAC) and Physical Layer (PHY) Specifications", Oct. 29, 2009.

(56) References Cited

OTHER PUBLICATIONS

Kim et al., "Design of Rate-Compatible Irregular LDPC Codes for Incremental Redundancy Hybrid ARQ Schemes", IEEE International Symposium on Information Theory (ISIT), pp. 1139-1143, Seattle, USA, Jul. 2006.

Kou et al., "Low Density Parity Check Codes Based on Finite Geometries: A Rediscovery and New Results", IEEE Transactions on Information Theory, vol. 47, No. 7, pp. 2711-2736, Nov. 2001.

Li et al., "Rate-Compatible Low Density Panty Check Codes for Capacity-Approaching ARQ Schemes in Packet Data Communications", Proceedings of the International'Conference on Communications, Internet and Information Technology (CIIT), U.S. Virgin Islands, Nov. 2002.

Yazdani et al., "On Construction of Rate-Compatible Low-Density Parity-Check Codes", IEEE Communication Letters, vol. 8, No. 3, pp. 159-161, Mar. 2004.

Darabiha et al., "Power Reduction Techniques,Techniques for LDPC Decoders", IEEE Journal of Solid-State Circuits, vol. 43, No. 8, pp. 1835-1845, Aug. 2008.

Fossorier., "Soft-input soft-output decoding of linear block codes based on ordered statistics", Global Telecommunications Conference (GLOBECOM), vol. 5, pp. 2828-2833, Nov. 8-12, 1998.

Justesen, "Performance of Product Codes and Related Structures viral Iterated Decoding", IEEE Transactions on Communications, vol. 59, No. 2, pp. 407-415, Feb. 2011.

Le et al., "Distance-Based Decoding of Block Turbo Codes", IEEE Communications Letters, vol. 9, No. 11, pp. 1006-1008, Nov. 2005.

Djordjevic et al., "Generalized Low-Density Parity-Check Codes for Optical communication Systems", Journal of lightwave technology, vol. 23, No. 5, pp. 1939-1946, May 2005.

Pyndiah., "Near-Optimum Decoding of Product Codes: Block Turbo Codes" IEEE Transactions on Communications, vol. 46, No. 8, pp. 1003-1010, Aug. 1998.

Benedetto et al., "Serial Concatenation of Interleaved Codes: Performance Analysis, Design, and Iterative Decoding," IEEE Transactions on Information Theory, vol. 44, No. 3, pp. 909-926, May 1998.

Al-Dweik et al., "Closed-Chains Error Correction Technique for Turbo Product Codes", IEEE Transactions on Communications, vol. 59, No. 3, pp. 632-638, Mar. 2011.

Whiting, D.L., "Bit-Serial Reed-Solomon Decoders in VSLI", Doctor Thesis, California Institute of Technology, 156 pages, Aug. 22, 1984.

\* cited by examiner

GLDPC SOFT DECODING WITH HARD DECISION INPUTS

TECHNICAL FIELD

Embodiments described herein relate generally to Error Correcting Coding (ECC), and particularly to methods and systems for ECC decoding.

BACKGROUND

Some types of error correction codes, such as Generalized Low Density Parity Check (GLDPC) codes, are commonly decoded using iterative decoding processes. Various decoding schemes for GLDPC codes are known in the art. For example, U.S. Pat. No. 8,812,939, whose disclosure is incorporated herein by reference, describes systems and methods for decoding data using a decoder that includes a primary decoder and an auxiliary decoder. A code word is retrieved from a storage device. The primary decoder attempts to decode the code word using hard data associated with the code word. If the primary decoder fails, an indication of the failure may be received by a decoder controller, which activates the auxiliary decoder. The auxiliary decoder attempts to decode the code word using either hard data or soft data associated with the code word.

U.S. Patent Application Publication 2014/0258809, whose disclosure is incorporated herein by reference, describes systems and methods for decoding data. A variable node value for a variable node is received at a first time, and reliability data for the variable node is received at a second time. The variable node is decoded using a first decoding scheme after the first time and before the second time, and the variable node is decoded using a second decoding scheme different from the first decoding scheme after the second time.

U.S. Patent Application Publication 2012/0240007, whose disclosure is incorporated herein by reference, describes a solid state storage device that includes a flash memory and a controller, which is configured to store data in the flash memory via a plurality of channels. The stored data is encoded using a Low Density Parity Check (LDPC) code. Hard decision decoders are configured to decode encoded data received from the flash memory via respective channels of the plurality of channels using the LDPC code and to provide the decoded data to the controller in response to one or more read commands from the controller. A soft decision decoder is configured to decode the encoded data received from the flash memory using the LDPC code and to provide the decoded data to the controller in response to one of the plurality of hard decision decoders failing to decode the encoded data. The encoded data is obtained by the soft decision decoder using a plurality of read-retry operations.

SUMMARY

An embodiment that is described herein provides a decoder that includes circuitry and a soft decoder. The circuitry is configured to receive channel hard decisions for respective bits of a Generalized Low-Density Parity Check (GLDPC) code word that includes multiple component code words, including first and second component code words having one or more shared bits, to schedule decoding of the GLDPC code word, and following the decoding, to output the decoded GLDPC code word. The soft decoder is configured to receive the channel hard decisions corresponding to the first component code word, to further receive soft reliability measures that were assigned to the shared bits in decoding the second component code word, and to decode the first component code word based on the channel hard decisions and the soft reliability measures.

In some embodiments, the soft decoder is configured to assign equal reliability measures to the channel hard decisions prior to decoding. In other embodiments, the circuitry further includes a hard decoder, which is configured to decode the GLDPC code word from the channel hard decisions, and the circuitry is configured to activate the soft decoder in response to a decoding failure of the hard decoder. In yet other embodiments, the circuitry is configured to select as input for the soft decoder, based on a predefined criterion, either the channel hard decisions or an output of the hard decoder as appears at a time of decoding failure, and to decode the GLDPC code word from the selected input using the soft decoder.

In an embodiment, the multiple component code words were encoded in accordance with respective component codes, the hard decoder is configured to decode the multiple component code words, and the predefined criterion is based on a number of the component codes that have failed to successfully decode as part of the decoding failure. In another embodiment, the circuitry is configured to select the output of the hard decoder when the number is below a predefined threshold number, and to select the channel hard decisions, otherwise. In yet another embodiment, the soft decoder is configured to assign reliability measures to the respective hard decisions based on a set of most probable component code words, which is smaller than an entire set of valid component code words.

In some embodiments, the GLDPC code word is stored in a memory device, and the circuitry is configured to receive the channel hard decisions from the memory device. In other embodiments, the GLDPC code word is received in a communication signal, and the circuitry is configured to receive the channel hard decisions from a receiver that receives the communication signal.

There is additionally provided, in accordance with an embodiment that is described herein, a method for decoding including receiving in a soft decoder channel hard decisions for respective bits of a Generalized Low-Density Parity Check (GLDPC) code word that includes multiple component code words, including first and second component code words having one or more shared bits. The GLDPC code word is decoded by accepting by the soft decoder channel hard decisions corresponding to the first component code word, and soft reliability measures that were assigned to the shared bits in decoding the second component code word, and decoding the first component code word based on the channel hard decisions and the soft reliability measures.

These and other embodiments will be more fully understood from the following detailed description of the embodiments thereof, taken together with the drawings in which:

DETAILED DESCRIPTION OF EMBODIMENTS

Overview

Figure 1:
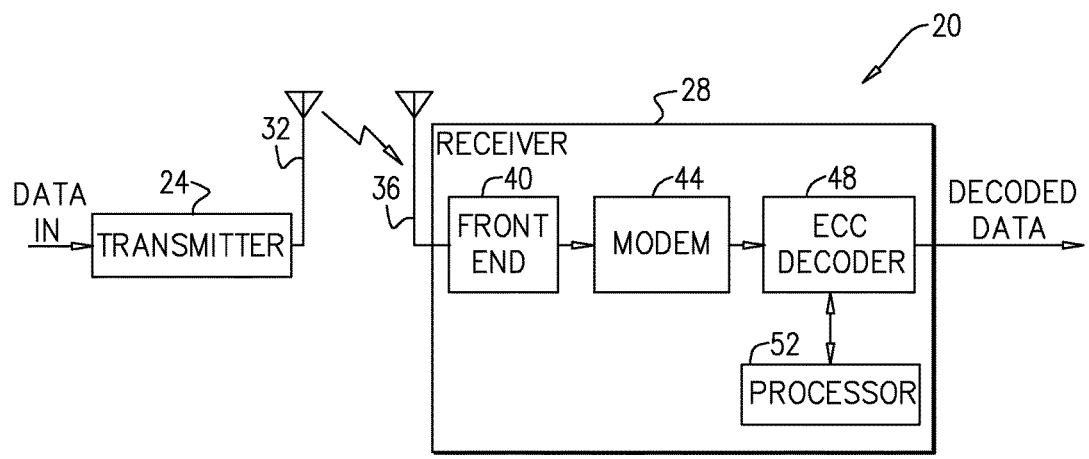
FIG. 1 is a block diagram that schematically illustrates a communication system that uses Error Correction Coding (ECC), in accordance with an embodiment that is described herein.

GLDPC codes typically comprise multiple sub-codes or component codes. GLDPC encoding produces GLDPC code words that comprise multiple component code words, each encoded using one of the underlying component codes. The component code words, which are typically much shorter than the GLDPC code word, may comprise any suitable linear codes, such as, for example, Hamming codes, Bose-Chaudhuri-Hocquenghem (BCH) codes, Reed-Solomon (RS) codes and Reed-Muller (RM) codes, or any suitable non-linear codes. A GLDPC code may comprise as few as thirty or less component codes, or as many as thousands or more component codes.

GLDPC codes are typically designed so that each of the component code words shares one or more bits with at least one other component code word. Thus, each bit of the GLDPC code word belongs to a single component code word or shared among multiple component code words. A valid GLDPC code word comprises valid component code words of the underlying component codes.

One possible way to decode a given GLDPC code word is to decode the individual component code words e.g., sequentially, using respective component decoders. Such a decoder would perform one or more decoding iterations in an attempt to reach a state in which each of the component decoders outputs a valid component code word. Sharing of bits among component codes assists in correcting erroneous bits beyond the error correction capabilities of the individual component codes.

The component decoders in the above scheme may comprise hard or soft decoders whose input and output comprise hard decisions or soft information, respectively. The soft information comprises, in addition to the hard decisions, respective reliability measures that are assigned to these hard decisions. The reliability measures may comprise Log Likelihood Ratios (LLRs), wherein each LLR typically has a sign, which is indicative of the hard decision or bit value, and an absolute value indicative of the reliability of that bit value. Alternatively, any other suitable reliability measures can also be used.

The input to a GLDPC hard decoder conventionally comprises channel hard decisions for the bits of the code word, and the input to a GLDPC soft decoder conventionally comprises, in addition to the hard decision bits, reliability measures assigned to these bits. Each of the underlying component decoders receives part of the input corresponding to the respective component code word.

In GLDPC hard decoding, the hard component decoders accept the channel hard decisions and derive output hard decisions that are used by some of component decoders in the same or subsequent iterations. In some variant hard decoders, the output of the component decoders is combined with the channel hard decisions to be used in subsequent iterations. In GLDPC soft decoding, the soft component decoders accept the channel soft information and derive output soft information that is used by some of the component decoders in the same or subsequent iterations. In a given iteration, a component soft decoder updates its output soft information based on the channel soft inputs, previously generated soft outputs, and its decoding results.

Typically, GLDPC soft decoders have better error correcting capabilities than GLDPC hard decoders, but incur higher complexity, latency and power consumption. Soft decoders are additionally less vulnerable to trapping sets than hard decoders. A trapping set is a decoding state in which one or more of the component code words fail to decode to a valid component code word, but applying additional decoding iterations does not resolve the failure state. A trapping set in a hard decoder occurs, for example, when multiple component code words share a number of erroneous bits that exceeds the error correction capabilities of the underlying component codes.

Embodiments that are described herein provide improved methods and systems for GLDPC decoding. Although soft decoders are traditionally designed to accept soft information, in the disclosed techniques the GLDPC soft decoder comprises soft component decoders that are configured to accept hard or soft decisions, thus saving the costs (e.g., latency and power consumption) of generating the soft information by doing so only when necessary. When avoiding soft decoding using soft information the complexity is also reduced. A GLDPC decoder thus first attempts decoding based on the channel hard decisions, and when this attempt fails proceeds to decoding based on channel or other soft information.

Soft decoding with no soft channel information is expected to perform no better than hard decoding. The disclosed techniques demonstrate, however, using the Chase decoding algorithm as an example soft component decoder, that the error correction capabilities of GLDPC soft decoding based on the channel hard decisions, although unexpected, outperforms conventional GLDPC hard decoding.

Some of the disclosed embodiments combine GLDPC hard and soft decoding, wherein the soft decoding is based on channel hard decisions, as explained above. In some embodiments, the GLDPC decoder first attempts to decode the GLDPC code word using hard decoding, and in response to hard decoding failure, the GLDPC decoder applies soft decoding using the hard decisions. In an embodiment, if this soft decoding using the channel hard decisions fails, soft reliability measures are assigned to the channel hard decisions and the soft decoder attempts to decode using the soft channel inputs. Selective application of the soft decoding reduces the latency and power consumption of the GLDPC decoder.

In some embodiments, the GLDPC decoder selects the input to the GLDPC soft decoder (i.e., hard or soft input) using a predefined criterion. In one embodiment, when hard decoding fails, the GLDPC decoder performs GLDPC soft decoding (using hard inputs) over the same input as the GLDPC hard decoder or over the GLDPC hard decoder outputs. In another embodiment, the GLDPC decoder applies soft decoding to the (hard decisions) output of the GLDPC hard decoder.

In yet another embodiment, the predefined selection criterion depends on the number of component codes that have failed to decode a valid component code word (i.e., using hard decoding). For example, when the number of failing hard component decoders is below a predefined threshold number, the GLDPC hard decoder is likely to have reached a trapping set state, and therefore the GLDPC decoder applies soft decoding to the output of the GLDPC decoder to resolve the trapping set state. Otherwise, the GLDPC decoder applies soft decoding to the same input as the GLDPC hard decoder.

Using soft decoding may lower the decoding error floor significantly. For instance, a code that produces 8 Kbyte code words and has a rate of 0.90 can achieve Frame Error Rate (FER) of 1e-3 before hitting an error floor when decoded using a conventional HIHO decoder. Such codes are therefore impractical without using a retransmission mechanism. Using SISO decoder(s) as in the disclosed techniques, however, can achieve a typical FER as low as 1e-11.

For the example code mentioned above, the inventors demonstrate decoding gains as follows: for FER values of 1e-2, 1e-3, and 1e-4, the gains are 0.2 dB, 0.6 dB and more than 1.0 dB, respectively. FER performance graphs (in decoding another code having a 0.94 rate) of a conventional GLDPC decoder and a GLDPC decoder that is based on the disclosed techniques are described further below.

System Description

FIG. 1 is a block diagram that schematically illustrates a wireless communication system 20 that uses error correction coding, in accordance with an embodiment that is described herein. System 20 comprises a transmitter 24, which transmits data to a receiver 28. The transmitter accepts input data, encodes the data with a certain ECC (the encoded data is also referred to as a code word), modulates the encoded data in accordance with a certain modulation scheme, converts the modulated digital signal to an analog signal, up-converts the analog signal to a suitable Radio frequency (RF), and transmits the RF signal toward the receiver using a transmitting antenna 32.

In receiver 28, a receiving antenna 36 receives the RF signal and provides it to a RF front end 40. The front end down-converts the RF signal to baseband or to a suitable Intermediate Frequency (IF), and digitizes the signal with a suitable Analog to Digital Converter (ADC—not shown in the figure). The digitized signal carrying the ECC-encoded data (i.e., the received code word possibly containing one or more errors) is demodulated by a modem 44, and the ECC is decoded by an ECC decoder 48. Decoder 48 is controlled by a processor 52. The structure and functionality of decoder 48 are described in detail below. By decoding the ECC, decoder 48 reconstructs the data that was input to transmitter 24. The reconstructed data is provided as the receiver output.

System 20 may comprise, for example, a cellular system, a satellite system, a point-to-point communication link, or any other suitable communication system that employs ECC. Although the example of FIG. 1 refers to a wireless communication system, the techniques described herein can be used with wire-line communication systems, such as cable communication systems or optical communication systems, as well.

Figure 2:
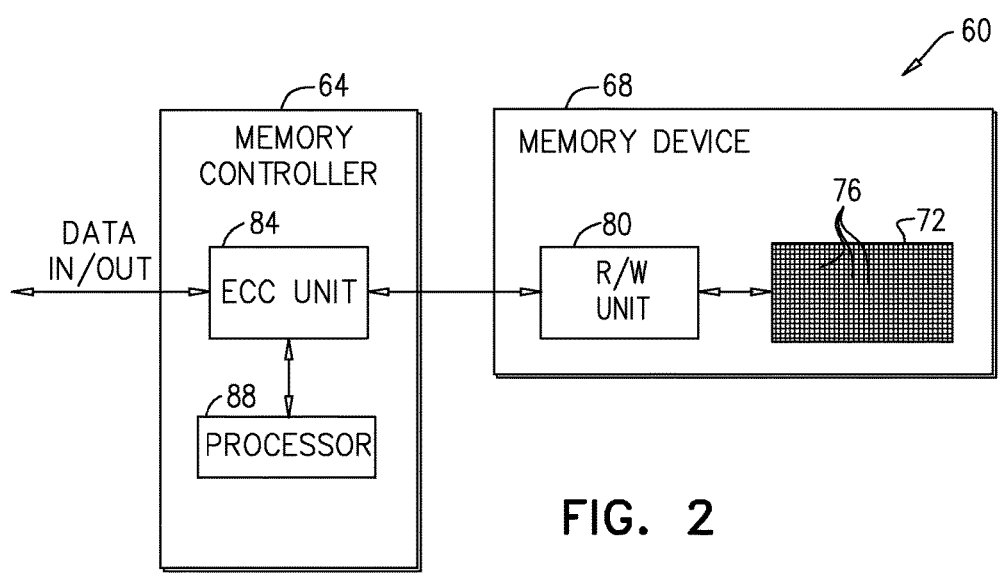
FIG. 2 is a block diagram that schematically illustrates a memory system that uses Error Correction Coding (ECC), in accordance with an embodiment that is described herein.

FIG. 2 is a block diagram that schematically illustrates a data storage system 60 that uses error correction coding, in accordance with an alternative embodiment that is described herein. System 60 comprises a memory controller 64, which stores data in a memory device 68. Memory device 68 comprises an array 72 comprising multiple memory cells 76. Array 72 may comprise any suitable type of volatile or non-volatile memory, such as, for example, Random Access Memory (RAM) or Flash memory. Alternatively, device 68 may comprise a magnetic storage device such as a Hard Disk Drive (HDD), or any other suitable storage medium. System 60 can be used in various host systems and devices, such as in computing devices, cellular phones or other communication terminals, removable memory modules, Solid State Disks (SSD), digital cameras, music and other media players and/or any other system or device in which data is stored and retrieved.

Memory device 68 comprises a Read/Write (R/W) unit 80, which writes data values into memory cells 76 and reads data values from the memory cells. Memory controller 64 comprises an ECC unit 84, which encodes the data for storage in accordance with a certain ECC, and decodes the ECC of data that is retrieved from the memory cells. Unit 84 is controlled by a processor 88. The structure and functionality of unit 84 are described in detail below. The ECC used in systems 20 and 60 may comprise, for example, a Generalized Low Density Parity Check (GLDPC) code, as well as various other types of ECC.

The ECC decoding schemes described herein can be used in communication systems such as system 20, as well as in data storage systems such as system 60. The description that follows applies to both communication applications and to storage applications, and refers generally to an ECC decoder. Any reference to the ECC decoder applies to decoder 48 of system 20, as well as to the decoder functionality of unit 84 in system 60. Alternatively, the methods described herein can be carried out by any other suitable element in any other suitable system that involves ECC decoding.

GLDPC Codes

A GLDPC code typically comprises multiple component codes, and a code word generated in accordance with a given GLDPC code (also referred to herein as a GLDPC code word) comprises multiple component code words, each encoded in accordance with a respective underlying component code. Example component codes include Hamming, BCH, Reed-Solomon and Reed-Muller codes.

Each of the component code words shares one or more bits with at least one other component code word of the GLDPC code word. Additionally, each bit of the GLDPC code word belongs to a single component code word or shared among multiple component code words. In some practical embodiments, the GLDPC code comprises component codes that are capable of correcting up to four errors, and each bit of the GLDPC code word is shared among up to three component code words. Note that a shared bit can be an information bit or a parity check bit that is jointly encoded by multiple component code encoders.

Different component code words of a given GLDPC code word may be encoded using the same or different component codes. GLDPC codes for which each bit in the GLDPC code word is shared by the same number of component code words, and whose component code words are all encoded using the same linear block code, are referred to as regular codes. Otherwise, the GLDPC code is referred to as an irregular code.

GLDPC codes can be constructed in various ways. Example GLDPC codes include, among others, Turbo Product Codes (TPC) and Serially Concatenated Codes (SCC). GLDPC codes are described, for example, by Djordjevic et al., in "Generalized Low-Density Parity-Check Codes for Optical communication Systems," Journal of lightwave technology, vol. 23, no. 5, May, 2005, pages 1939-1946, whose disclosure is incorporated herein by reference. TPCs are described, for example, by Pyndiah, in "Near-Optimum Decoding of Product Codes: Block Turbo Codes," IEEE Transactions on Communications, vol. 46, no. 8, August, 1998, pages 1003-1010, which is incorporated herein by reference. SCCs are described, for example, by Benedetto et al., in "Serial Concatenation of Interleaved Codes: Performance Analysis, Design, and Iterative Decoding," IEEE Transactions on Information Theory, vol. 44, no. 3, May, 1998, pages 909-926, which is incorporated herein by reference.

Decoding GLDPC Codes

A valid GLDPC code word generated in accordance with a given GLDPC code comprises a set of valid component code words of the underlying component codes. A decoder suitable for decoding the GLDPC code word is also referred to herein as a "GLDPC decoder," and a decoder suitable for decoding a given component code word is referred to herein as a "component decoder."

In some embodiments, a GLDPC decoder performs an iterative process, in which the processing in each of the iterations comprises sequential decoding of the individual component code words using the respective component decoders. The overall GLDPC decoding succeeds when the decoding of all the component codes results in valid respective component code words.

Note that since each component code word shares one or more bits with at least one other component code word, correcting an erroneous bit in one component code word can assist in the decoding of other component code words that share this bit.

The component decoders may comprise hard decoders whose input and output comprise hard decisions, which are also referred to herein as Hard-Input Hard-Output (HIHO) decoders, or soft decoders whose input and output comprise soft information, which are also referred to herein as Soft-Input Soft-Output (SISO) decoders. The soft information can be viewed as a combination of hard decisions and respective reliability measures, which are assigned to these hard decisions.

In some embodiments, the reliability measures comprise Log Likelihood Ratios (LLRs). Each LLR typically comprises a sign, which is indicative of the hard decision or bit value, and an absolute value indicative of the reliability of that bit value. In some embodiments, the LLR assigned to a given hard decision or bit depends on the ratio between the probabilities of the bit value being '1' and '0'. The disclosed techniques are not limited, however, to LLRs and can be used with any other suitable type of soft reliability measures.

During the iterative decoding the component decoders derive hard or soft information, which is used by some of the component decoders in the same or subsequent iterations. Thus, although a given bit may be initially erroneous, after being corrected by some component decoder, the bit arrives corrected at other component decoders whose input includes this bit.

In an embodiment, the soft information derived is passed along with the channel soft information to be used by the soft component decoder that has produced this soft information, or by other soft component decoders during the current or in subsequent iterations. In some embodiments, output data generated by a certain component decoder is passed only to other component decoders, and is not fed back to the same component code word that has generated this data.

Typically, GLDPC soft decoders have better error correction capabilities than GLDPC hard decoders, because the soft information (e.g., reliability measures assigned to the hard decisions), which the decoder can utilize for improved decoding, is available only to the soft decoders. Compared to hard decoding, however, executing soft decoding, as well as generating the soft channel information, incurs higher complexity, latency and power consumption. Another advantage of soft decoders is that soft decoders are typically less vulnerable to trapping sets than hard decoders.

A trapping set refers to a failure decoding state in which not all of the component codes are decodable, but applying additional decoding iterations cannot resolve the failure state. A trapping set in a hard decoder occurs, for example, when multiple component code words share a number of erroneous bits that exceeds the error correction capabilities of the underlying component codes. For example, assume that the component codes can correct up to three bits, and that the GLDPC decoder has reached a state in which two component code words alone share a group of four erroneous bits. In this state, each of the component codes fails to produce a respective valid component code word, and therefore the component codes cannot assist each other in decoding during further iterations. In soft decoding, iterating over the component codes may in certain situations resolve such a trapping state.

Although soft decoders are traditionally designed to accept soft information, in the disclosed techniques the GLDPC decoder comprises soft component decoders that are configured to accept hard or soft decisions from the channel, thus saving the costs of generating soft channel information when soft decoding using the hard decisions input succeeds, as will be described further below.

In the context of the present patent application and in the claims, terms such as "hard information," "hard inputs," "hard outputs," "hard decisions," "hard reliability measures" and "hard bits" all refer to values that can be each represented by a single bit. Terms such as "soft information," "soft inputs," "soft outputs," "soft decisions," "soft reliability measures" and "soft bits" all refer to values that are each represented by more than a single bit.

Component Soft Decoding when Channel Soft Information is Available

Decoding the component code words using SISO decoders can be done in various ways. For example, in "Distance-Based Decoding of Block Turbo Codes," IEEE Communications Letters, vol. 9, no. 11, November, 2005, pages 1006-1008, which is incorporated herein by reference, Le et al. describe a decoding approach that is based on the distance properties of the component code words. As another example, Fossorier and Lin describe a SISO decoder, in "Soft-input soft-output decoding of linear block codes based on ordered statistics," Global Telecommunications Conference (GLOBECOM), vol. 5, Nov. 8-12, 1998, pages 2828-2833, which is incorporated herein by reference. As yet another example, in "Near-Optimum Decoding of Product Codes: Block Turbo Codes," cited above, Pyndiah describes iterative soft decoding of a product code or a block turbo code whose component codes comprise linear block codes, using the (component) Chase decoding algorithm. A decoder that operates in accordance with the principles described by the Pyndiah reference cited above is also referred to as a "Pyndiah decoder."

A SISO component decoder that operates in accordance with the Chase algorithm is also referred to herein as a "Chase decoder." The Chase algorithm reduces decoding complexity by searching for the correct component code word in a small set that includes only test patterns that are considered the most probable to decode into valid component code words, instead of searching the entire set of valid component code words.

Some variant embodiments of the Chase algorithm independently assign a reliability measure to each of the hard decision bits, based on those test patterns that were successfully decoded. In an embodiment, the Pyndiah decoder uses the reliability measures assigned by the Chase algorithm to generate extrinsic information for updating the input reliability measures.

A linear (n, k) component code comprises $2^k$ valid component code words. In some embodiments, the Pyndiah decoder comprises a component code that has a distance d among the component code words (typically d is much smaller than k), and the Chase algorithm of the component decoder attempts to decode $2^{(d/2)}$ test patterns.

In other embodiments, the Chase decoder may attempt a larger search. For example, for a (610, 580) BCH component code, the Chase decoder may attempt decoding up to $2^{12}$ different test patterns, of which as few as about 250 test patterns may decode into valid component code words. In other embodiments, for example when the bit or frame error rate is assumed relatively low, a fast Chase decoder may attempt decoding $2^6$ different test patterns, of which up to about 15 may result in valid component code words.

The Chase algorithm comprises soft input and output. The soft input is initialized with the channel soft information (when available), or updated soft information produces by previous SISO decoding of other component codes (or its own output produced in previous iterations). The algorithm then generates soft output information, which is used to update the soft input. We now describe an iterative Pyndiah decoder that is based on a variant of the Chase algorithm. The Pyndiah decoder implements a full GLDPC decoder, using the Chase component decoder. Following the Chase component decoding, the Pyndiah decoder generates extrinsic information, scales the extrinsic information and produces output reliability measures based on the scaled extrinsic information. The Pyndiah decoder uses an iterative decoding scheme, where in each iteration all the component codes are decoded.

The variant Chase algorithm comprises the following main steps:

Initialize the input of the Chase decoder with updated soft information (e.g., if no updated soft information is available, channel information is used). Assuming an n-bit component code word, the soft input includes n hard decisions and n respective reliability measures.

Using the reliability measures of the soft input identify the p least reliable bits, and determine $2^p$ n-bit test patterns, wherein each of the test patterns comprises one of the $2^p$ bit-combinations in the identified p bits, and the hard decisions of the respective soft inputs in the other n-p bits. The operation of generating the $2^p$ n-bit test patterns (or any other suitable number) is also referred to as enumeration.

Find candidate code words: decode each of the test patterns using hard decoding and associate with each successfully decoded code word a respective score value. Produce a candidate list that includes the successfully decoded code words and associated scores. In some embodiments, for example when assuming an Additive White Gaussian Noise (AWGN) noise-model, the score value equals the Euclidian distance between the code word (in which zeros are replaced by −1 and ones by +1) and the input reliability measures.

Assign Chase reliability measures to the respective hard decision outputs based on the candidate list and the respective scores.

The Pyndiah decoder executes the following main operations:

For each of the n bits calculate extrinsic information as the difference between the assigned Chase reliability measure and the respective input reliability measure.

Multiply the extrinsic information by some factor α (the value of α may be constant or depend on the iteration number), add the multiplication result to the channel reliability measure, and use the result as updated soft inputs for the next iteration. Derive updated hard decisions to be the sign information of the updated soft values.

In an embodiment, the GLDPC decoder executes an iterative decoding process. Within each decoding iteration, the GLDPC decoder decodes each of the component codes using, for example, a Chase decoder. The GLDPC decoder (e.g., a Pyndiah decoder) repeats the decoding iterations until decoding a valid code word, or the number of iterations exceeds a predefined maximal number.

Component Soft Decoding Using Channel Hard Decisions

As described above, it is possible to design soft component decoders that accept soft information from the channel. For example, the Chase algorithm described above, uses the soft information to generate a small group of candidate code words.

In the disclosed techniques, on the other hand, the GLDPC decoder first attempts hard decoding based on the channel hard inputs, and if this decoding fails attempts soft decoding based on hard inputs (i.e., hard decisions of the channel or the hard decoding outputs). When soft decoding based on hard inputs fails, the GLDPC decoder attempts decoding based on soft inputs.

Soft decoding using the channel hard decisions could be expected to be unbeneficial because in the Chase algorithm, for example, when channel soft information is unavailable, the decoder assigns to the channel hard decisions equal reliability measures. (Alternatively, the soft reliability measures that are related to a given component code may depend on the number of component codes that have failed, among the component codes that share these inputs. Thus, bits for which many component codes succeed to decode are assigned high reliability and vice versa.)

When assigning equal reliability measures to the channel hard decisions, as described above, the Chase algorithm can at best select the p least reliable bits randomly (or at fixed predefined positions), resulting in low probability of including the correct code word in the candidate list (i.e., in a set that includes the decodable test patterns). The disclosed techniques, however, demonstrate that the proposed approach is indeed beneficial as will be described below.

In some embodiments, even when the channel soft information is unavailable, in certain situations the Chase decoder is likely to include the correct code word in the candidate list. This may happen, for example, when the input hard decisions include only a small number of erroneous bits (e.g., within the error correcting capability of the hard decoding phase), or when one of the $2^p$ test patterns whose p least reliable bits were selected at random, successfully decodes to the correct code word.

The score value, which the Chase algorithm assigns to the correct code word, is typically much lower (e.g., when the score is based on Euclidian distance of the successfully decoded test patterns from the received soft inputs) than the score the algorithm assigns to the other candidate code words, which results in assigning high reliability measures to the respective input hard decisions. On the other hand, when the Chase decoder does not include the correct code word in the candidate list, the Chase algorithm typically assigns similar score values to the leading and other code words in the candidate list, resulting in assigning low reliability measures to the input hard decisions.

Consequently, as the iterations of the GLDPC decoder advance, erroneous bits that are shared among several component code words, and that were not previously corrected by any of the respective component decoders, e.g., because the correct code word was excluded from the candidate list, are likely to get low reliability measures (as explained above). Therefore the probability to include these bits within the p least reliable bits increases accordingly. When the least reliable p bits include a sufficiently large number of the erroneous bits, one of the test patterns (that may still include a number of errors within the error correction capability) decodes to the correct code word.

Configuring the soft component decoders of a GLDPC soft decoder to operate on channel hard decisions (and not soft information) may be also beneficial in resolving trapping sets. Assume, for example, a GLDPC hard decoder reaching a trapping set state. We demonstrate that trapping sets can be resolved by applying a GLDPC soft decoder to the output of the GLDPC hard decoder that has reached a trapping set state.

Note that during the iterations of the GLDPC decoder, the soft component decoders (e.g., Chase decoders) are likely to assign lower reliability measures to the bits that cause the trapping set state compared to other bits. The bits that cause the trapping set are shared among multiple component codes that fail to decode, and their Chase enumeration typically do not include the correct component code word, which results in assigning low reliability measures to these bits.

As the GLDPC iterations advance, the bits causing the trapping set state are likely to be included among the p least reliable bits, which increases the probability of including the correct code word in the candidate list. Consequently, the correct code word is expected to appear in the candidate list of one or more of the soft component decoders within a few iterations, thus resolving the trapping set state.

Combining Hard and Soft Decoding

Figure 3:
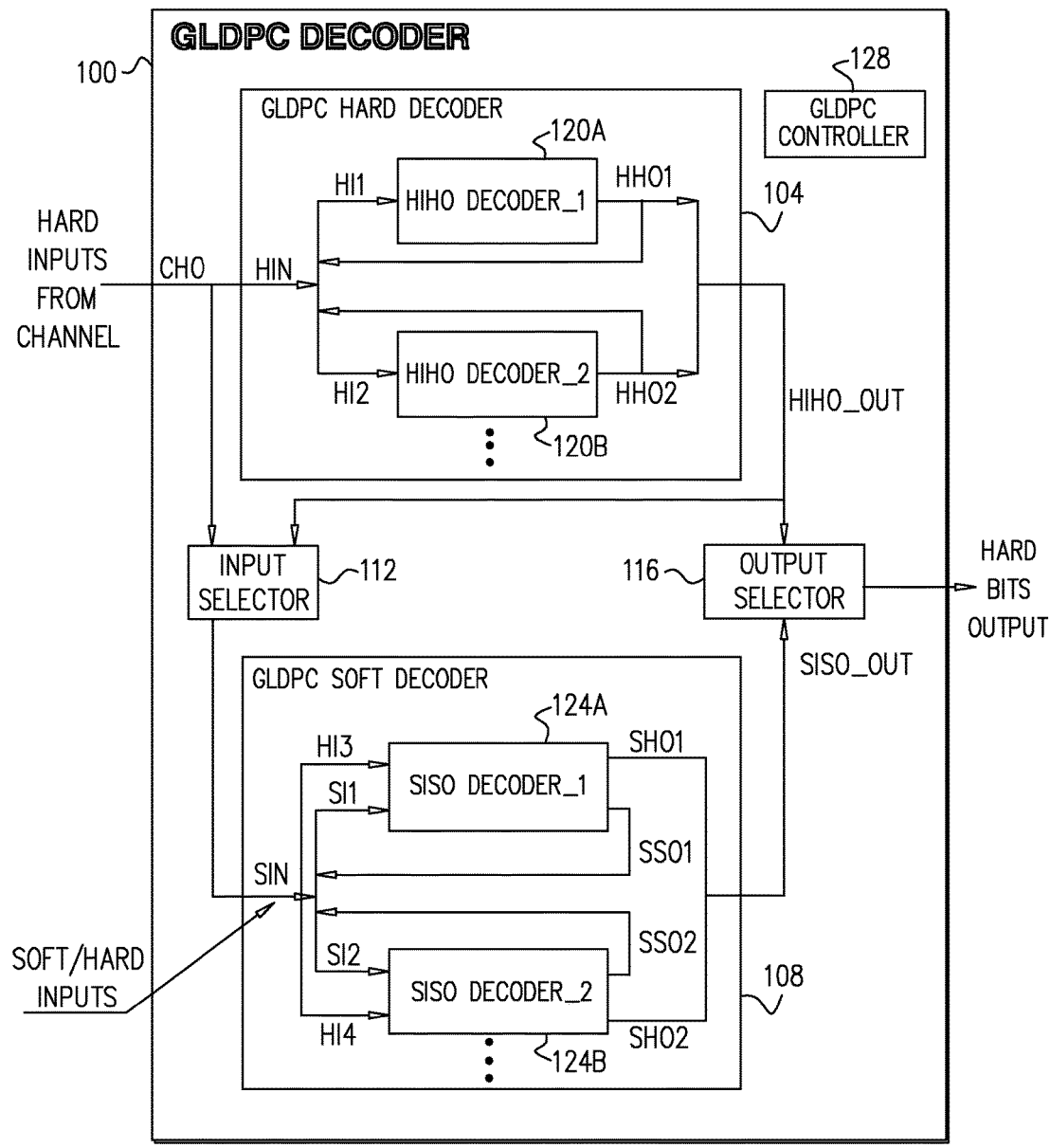
FIG. 3 is a block diagram that schematically illustrates a Generalized Low Density Parity Check (GLDPC) decoder, in accordance with an embodiment that is described herein.

FIG. 3 is a block diagram that schematically illustrates a GLDPC decoder 100, in accordance with an embodiment that is described herein. Decoder 100 can be used to implement decoder 48 of FIG. 1 above, or the decoding part of ECC unit 84 of FIG. 2 above. Decoder 100 accepts as input valid ECC code words, or other input that comprises corrupted code words (e.g., by noise) and therefore contain errors. In other words, the input to the decoder may not always comprise valid code words of the ECC. In the present example the valid ECC code words comprise GLDPC code words in accordance with a given GLDPC code.

In the description that follows, the input to decoder 100 is also referred to as the channel output, and denoted CHO in the figure. GLDPC decoder 100 performs decoding in an attempt to reconstruct the data conveyed in the code words. In a typical implementation, each GLDPC code word comprises on the order of several hundred to several thousand bits, although any other suitable code word size can be used.

Decoder 100 comprises a GLDPC hard decoder 104 and a GLDPC soft decoder 108. Hard decoder 104 decodes the hard decisions part (denoted HIN in the figure) of the channel output CHO using hard decoding techniques, and derives output hard decisions HIHO_OUT. An input selector 112 delivers either CHO or HIHO_OUT to an input SIN of soft decoder 108. GLDPC soft decoder 108 decodes input SIN using soft decoding techniques, resulting in soft decisions output SISO_OUT. GLDPC decoder 100 further comprises an output selector 116, which delivers either HIHO_OUT or hard decisions related to SISO_OUT (e.g., the sign part of the SISO_OUT soft information) as the final GLDPC code word bits. Various schemes for combining hard and soft decoding are described further below.

In some embodiments, hard decoder 104 comprises multiple hard component decoders 120, each configured to receive part of HIN corresponding to the respective underlying component code word. Alternatively, other configurations, in which a hard component decoder processes multiple component codes, are also possible. In an example embodiment, the GLDPC decoder comprises a single component decoder that processes all the component codes. FIG. 3 depicts two of the multiple component decoders, 120A and 120B whose inputs are denoted HI1 and HI2, respectively. Hard decoder 104 iteratively processes HIN so that in a given iteration decoder 104 decodes each of the component code words sequentially (or in any other suitable order), using the respective hard component decoders 120. When the decoding of a hard component decoder succeeds, the respective decoded component code word replaces the relevant inputs of HIN. For example, the outputs HHO1 and HHO2 of component decoders 120A and 120B replace the respective HI1 and HI2 parts of HIN. In alternative embodiments, the decoded component code word does not replace the relevant inputs of HIN, but is rather used for updating these inputs.

In some embodiments, soft decoder 108 may comprise, for example, a Pyndiah decoder comprising multiple soft component decoders 124, of which FIG. 3 depicts two decoders 124A and 124B. Alternatively, one or more soft decoders may be configured to process multiple component codes. Further alternatively, a single component decoder may be configured to process all the component codes. Soft decoders 124 may comprise Chase decoders executing the Chase algorithm described above. Alternatively, soft decoders 124 may comprise any other suitable soft decoders. The input of soft decoders 124 comprises a hard or soft input. For example, the inputs to decoders 124A and 124B include hard decisions HI3, HI4 and when necessary also reliability measures SI1, SI2, respectively.

Decoders 124 receive parts of SIN corresponding to the respective underlying component code words (i.e., hard decisions HI3 and HI4). In an embodiment, when decoding based on the channel hard inputs, decoder 124 initializes the soft information (e.g., SI1 and SI2 in the figure) with equal reliability measures. Decoders 124 decode their respective inputs and produce soft outputs that are fed back to update the soft inputs of the decoders. GLDPC soft decoder 108 processes its input SIN iteratively similarly to GLDPC hard decoder 104.

GLDPC decoder 100 comprises a GLDPC controller 128, which manages the various tasks of the decoder. In some embodiments, GLDPC controller 128 receives success/fail indications from hard decoder 104 (e.g., per hard component decoder) and activates soft decoder 108 based on the indications. In some embodiments, GLDPC controller 128 additionally receives success/fail indications from soft decoder

108. When soft decoding by soft decoder 108 using the hard decision inputs fails, controller 128 may configure decoder 100 to generate channel soft information and configure soft decoder 108 to re-decode using the soft channel inputs. GLDPC controller 128 additionally configures input selector 112 and output selector 116 to determine end-to-end and internal data flow.

GLDPC decoder 100 can schedule the operation of GLDPC hard decoder 104 and GLDPC soft decoder 108 in various ways. Typically, hard decoder 104 is advantageous over soft decoder 108 in terms of processing latency and power consumption. In the embodiments that will be described below, GLDPC decoder 100 starts executing hard decoder 104 alone, and activates soft decoder 108 in response to a decoding failure of hard decoder 104.

In one embodiment, when hard decoder 104 fails, soft GLDPC decoder configures input selector 112 to deliver channel output CHO to decoder 108, i.e., the same input used by hard decoder 104. In another embodiment, input selector 112 delivers the output of hard decoder 104 (HIHO_OUT) to soft decoder 108. In yet other embodiment, the selection of input selector 112 is determined based on a predefined criterion, which relates, for example, to the number of succeeding and/or failing component codes (using hard decoding).

As noted above, when soft decoder 108 fails to decode based on the channel or output hard decisions, GLDPC decoder 100 may generate channel soft information for the hard decisions that selector 112 delivers to soft decoder 108.

The configuration of decoder 100 in FIG. 3 is an example configuration, and in alternative embodiments any other suitable configuration can also be used. For example, although in FIG. 3 HIHO decoders 120 and SISO decoders 124 process a single component code word, in other embodiments, such as, for example, when the GLDPC code comprises a Turbo Product Code (TPC), each of decoders 120 and/or 124 can decode multiple component code words (corresponding to the rows and columns of the TPC matrix, respectively), e.g., in parallel.

In the context of the present patent application and in the claims, all the elements of GLDPC decoder 100 excluding soft decoder 108 are collectively referred to as circuitry. In the example of FIG. 3 above, the circuitry comprises hard decoder 104, input selector 112, output selector 116 and GLDPC controller 128. In some embodiments, the circuitry handles tasks such as, for example, receiving channel hard decisions for the respective bits of a given GLDPC code word, scheduling the decoding of the GLDPC code word, e.g., using hard decoder 104, soft decoder 108 or both, and following the decoding, outputting the decoded GLDPC code word.

In the example configuration of FIG. 3, hard decoder 104 and soft decoder 108 each comprises multiple underlying component decoders. This configuration, however, is not mandatory and other suitable configurations can also be used. For example, in alternative embodiments, one or more instances of a hard decoder and/or soft decoder may be each configured to process two or more component codes. In an example embodiment, a single (hard or soft) instance decoder processes all the underlying component codes.

Figure 4:
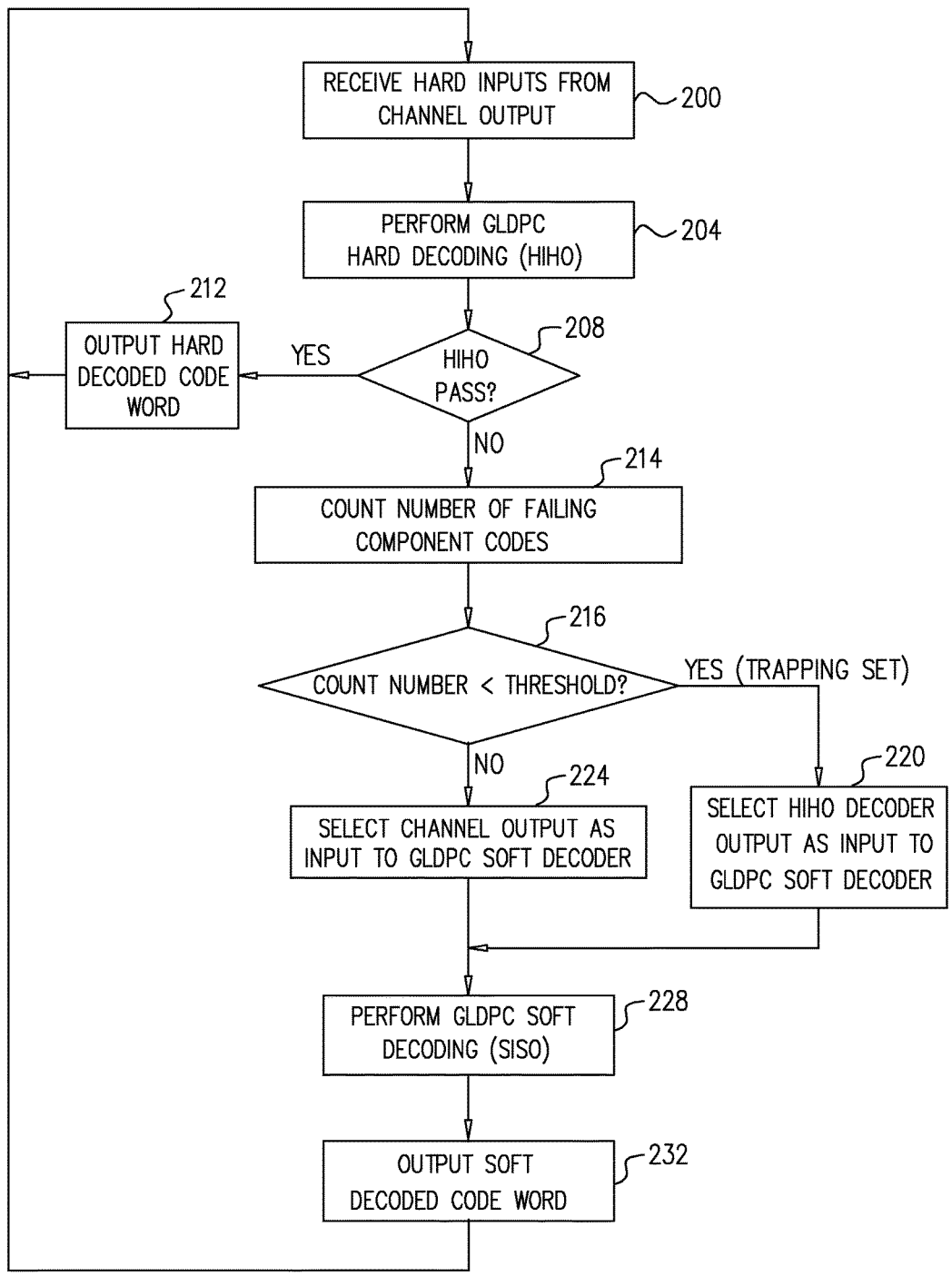
FIG. 4 is a flow chart that schematically illustrates a method for GLDPC decoding, in accordance with an embodiment that is described herein.

FIG. 4 is a flow chart that schematically illustrates a method for GLDPC decoding, in accordance with an embodiment that is described herein. The method begins by GLDPC decoder 100 receiving hard decision inputs from the channel output, at a reception step 200. At a hard decoding step 204, GLDPC hard decoder 104 attempts to decode the GLDPC code word based on the channel hard decisions.

At a checking step 208, GLDPC decoder 100 checks whether hard decoder 104 has succeeded in decoding the GLDPC code word. If at step 208 hard decoding has succeeded, output selector 116 outputs the successfully decoded GLDPC code word, at a hard selection step 212, and loops back to step 200 to receive subsequent inputs from the channel. Otherwise, hard decoding at step 208 has failed, and GLDPC decoder 100 counts the number of component codes that have failed at a counting step 214, and compares this count number to a predefined threshold number, at a comparison step 216.

In alternative embodiments, other criteria can be used at step 216. For example, such criteria may relate to statistical information regarding bit flip events, number of corrected errors, number of repeated bit flip applied per bit, and/or any other suitable criteria.

If at step 216 the count number is smaller than the threshold number (or when some other suitable criterion as mentioned above is fulfilled), hard decoder 104 is likely to have reached a trapping set, and at a hard output decoding step 220, GLDPC decoder 100 configures input selector 112 to deliver the output of hard decoder 104 to GLDPC soft decoder 108. Otherwise, the count number at step 216 is equal to or greater than the threshold number, and GLDPC decoder 100 configures input selector 112 to deliver the channel output to GLDPC soft decoder 108, at a channel selection step 224.

At a soft decoding step 228, GLDPC decoder 100 activates GLDPC soft decoder 108 so as to decode the GLDPC code word. At a soft output step 232, output selector 116 outputs the GLDPC code word decoded by GLDPC soft decoder 108, and the method loops back to step 200 to receive subsequent inputs from the channel.

The decoding configuration in FIG. 4 is given by way of example, and other suitable decoding configurations can also be used. For example, in some embodiments, selecting the input to soft decoder 108 when hard decoding fails at step 208 is independent on the number of failing component codes, and decoder 100 skips steps 214 and 216. In one embodiment decoder 100 continues to step 220 to select the output of hard decoder 104. Alternatively, decoder 100 continues to step 224 to select the channel hard decisions.

In some embodiments, when soft decoding that is based on hard decision inputs at step 228 fails, GLDPC decoder 100 assigns reliability measures to the hard decisions input to GLDPC soft decoder 108, which then performs soft decoding using these soft inputs.

ECC decoder 48 of FIG. 1, ECC unit 84 of FIG. 2 and ECC decoder 100 of FIG. 3 may be implemented in software, in hardware, or using a combination of hardware and software elements. In some embodiments, decoder 48, unit and/or decoder 100 comprises one or more processors capable of executing software for carrying out the functions described herein. The software may be downloaded to the processors in electronic form, over a network, for example, or it may, alternatively or additionally, be provided and/or stored on non-transitory tangible media, such as magnetic, optical, or electronic memory.

In some embodiments, decoder 48, unit 84 and/or decoder 100 (including hard decoder 104, soft decoder 108, input selector 112, output selector 116 and GLDPC controller 128) are implemented in hardware, such as using one or more Application-Specific Integrated Circuits (ASICs), Field-Programmable gate Arrays (FPGAs) and/or discrete components. Some or all of GLDPC decoder 100 functions may alternatively be implemented in software, or using a combination of software and hardware elements.

Figure 5:
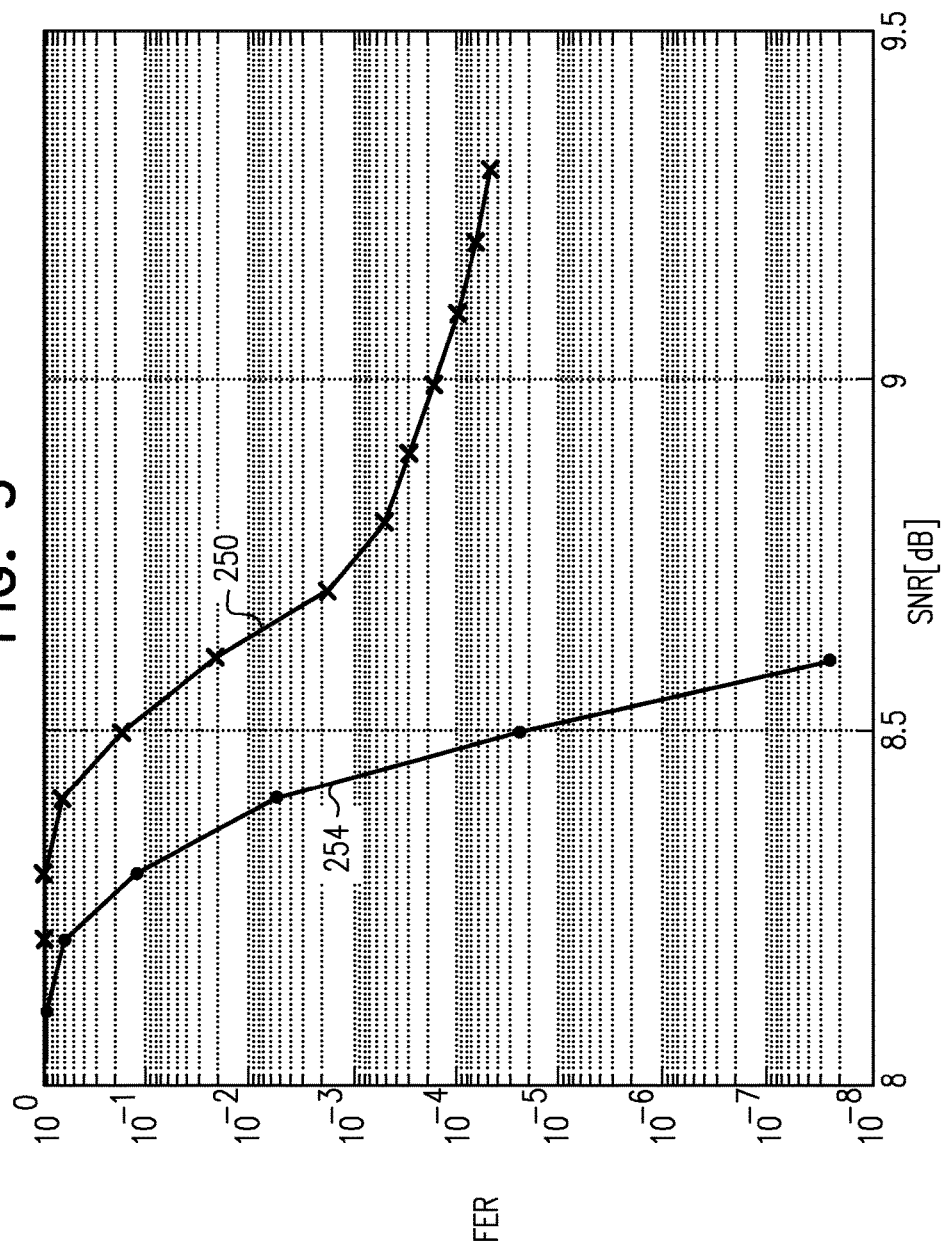
FIG. 5 is a graph showing simulated Frame Error Rate (FER) performance of a GLDPC decoder, in accordance with an embodiment that is described herein.

FIG. 5 is a graph showing simulated Frame Error Rate (FER) performance of conventional GLDPC decoding (curve 250) and of GLDPC decoding based on the disclosed techniques (curve 254). Curves 250 and 254 give the FER performance of the GLDPC decoders as a function of Signal to Nose Ratio (SNR). Both sets of results refer to a GLDPC code having code words of 8 kByte and a code rate equal to 0.94. The underlying component codes comprise BCH codes with error correction capability T=3 (i.e., each component code can correct up to three errors).

In implementing the component Chase decoders, the Chase algorithm was configured to attempt decoding $2^{12}$ different test patterns. As seen in FIG. 5, the decoder based on the disclosed techniques outperforms the conventional GLDPC decoder significantly. For example, at FER=1e-4, the respective performance gain is about 1 dB. Moreover, decoding based on the disclosed technique enable the GDLPC decoder to achieve low FER values that are unachievable in a conventional GLDPC decoder.

The disclosed techniques can be used, for example, in communication systems that operate at very high data rates (e.g., in short distance communications at 60 GHz). In such high-rate systems, implementing an Analog to Digital A/D converter for generating the soft inputs may be costly and therefore decoding may be advantageously based on hard decision inputs.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A decoder, comprising:
    input circuitry, which is configured to:
        receive channel hard decisions for respective bits of a Generalized Low-Density Parity Check (GLDPC) code word that comprises multiple component code words, including first and second component code words having one or more shared bits, wherein at least some of the received hard decisions for respective bits of the first and second component code words are erroneous, and wherein the GLDPC code word represents original data that was encoded into the GLDPC code word to allow recovering of the original data from the GLDPC code word despite errors in bits of the GLDPC code word;
    a soft decoder; and
    decoding circuitry, which is configured to:
        decode the second component code word;
        assign to the one or more shared bits, soft reliability measures, responsively to results of the decoding of the second component code word;
        decode the first component code word, by applying the soft decoder to the received channel hard decisions corresponding to the first component code word and to the soft reliability measures that were assigned to the shared bits responsively to decoding the second component code word;
        decode the remaining components of the code word, to recover the original data;
        and
        output the recovered original data, following the decoding,
    wherein the decoding circuitry reduces the latency and power consumption of the decoder.

2. The decoder according to claim 1, wherein the soft decoder is configured to assign equal reliability measures to the channel hard decisions other than the shared bits prior to decoding.

3. The decoder according to claim 1, wherein the decoding circuitry is configured to decode the GLDPC code word from the channel hard decisions without using the soft decoder and, when the decoding circuitry fails to decode the GLDPC code, the decoding circuitry is configured to activate the soft decoder.

4. The decoder according to claim 3, wherein the decoding circuitry is configured to select as input for the soft decoder, based on a predefined criterion, either the channel hard decisions or an output of the attempt to decode the GLDPC code word from the channel hard decisions as appears at a time of decoding failure, and to decode the GLDPC code word from the selected input using the soft decoder.

5. The decoder according to claim 4, wherein the multiple component code words were encoded in accordance with respective component codes, and wherein the predefined criterion is based on a number of the component codes that have failed to successfully decode as part of the decoding failure.

6. The decoder according to claim 5, wherein the decoding circuitry is configured to select the output of the attempt to decode the GLDPC code word from the channel hard decisions when the number is below a predefined threshold number, and to select the channel hard decisions, otherwise.

7. The decoder according to claim 1, wherein the soft decoder is configured to assign reliability measures to the respective hard decisions based on a set of most probable component code words, which is smaller than an entire set of valid component code words.

8. The decoder according to claim 1, wherein the GLDPC code word is stored in a memory device, and wherein the circuitry is configured to receive the channel hard decisions from the memory device.

9. The decoder according to claim 1, wherein the GLDPC code word is received in a communication signal, and wherein the circuitry is configured to receive the channel hard decisions from a receiver that receives the communication signal.

10. A method for decoding, comprising:
    in a decoder, receiving channel hard decisions for respective bits of a Generalized Low-Density Parity Check (GLDPC) code word that comprises multiple component code words, including first and second component code words having one or more shared bits, wherein at least some of the received hard decisions for respective bits of the first and second component code words are erroneous, and wherein the GLDPC code word represents original data that was encoded into the GLDPC code word to allow recovering of the original data from the GLDPC code word despite errors in bits of the GLDPC code word;
    decoding the second component code word;

assigning to the one or more shared bits, soft reliability measures, responsively to results of the decoding of the second component code word;

decoding the first component code word, by applying a soft decoder to the received channel hard decisions corresponding to the first component code word and to the soft reliability measures that were assigned to the shared bits responsively to decoding the second component code word;

decoding the remaining components of the code word, to recover the original data; and outputting the recovered original data from the decoder, following the decoding, wherein decoding the first component code word is performed based on: (i) the channel hard decisions received for the bits other than the shared bits, and (ii) the soft reliability measures received for the shared bits, and wherein the decoding reduces the latency and power consumption of the decoder.

11. The method according to claim 10, wherein applying the soft decoder comprises assigning equal reliability measures to the channel hard decisions other than the shared bits prior to decoding.

12. The method according to claim 10, comprising performing a first attempt of decoding the GLDPC code word from the channel hard decisions without using the soft decoder, and activating the soft decoder in response to a decoding failure of the attempt to decode the GLDPC code word from the channel hard decisions.

13. The method according to claim 12, comprising selecting an input to the soft decoder, based on a predefined criterion, as either the channel hard decisions or an output of the attempt to decode the GLDPC code word from the channel hard decisions as appears at a time of decoding failure, and decoding the GLDPC code word from the selected input using the soft decoder.

14. The method according to claim 13, wherein the multiple component code words were encoded in accordance with respective component codes, and wherein selecting the input comprises selecting the input based on a number of the component codes that have failed to successfully decode as part of the decoding failure.

15. The method according to claim 14, wherein selecting the input comprises selecting the output of the attempt to decode the GLDPC code word from the channel hard decisions when the number is below a predefined threshold number, and selecting the channel hard decisions, otherwise.

16. The method according to claim 10, wherein decoding the GLDPC code word comprises assigning reliability measures to the respective hard decisions based on a set of most probable component code words, which is smaller than an entire set of valid component code words.

17. The method according to claim 10, wherein receiving the channel hard decisions comprises retrieving the GLDPC code word from a memory device.

18. The method according to claim 10, wherein receiving the GLDPC code word comprises receiving the GLDPC code word in a communication signal.

19. A non-transitory computer-readable medium including instructions that, when executed by one or more processors cause the one or more processors to perform a decoding method comprising:

receiving channel hard decisions for respective bits of a Generalized Low-Density Parity Check (GLDPC) code word that comprises multiple component code words, including first and second component code words having one or more shared bits, wherein at least some of the received hard decisions for respective bits of the first and second component code words are erroneous, and wherein the GLDPC code word represents original data that was encoded into the GLDPC code word to allow recovering of the original data from the GLDPC code word despite errors in bits of the GLDPC code word;

decoding the second component code word;

assigning to the one or more shared bits, soft reliability measures, responsively to results of the decoding of the second component code word;

decoding the first component code word, by applying a soft decoder to the received channel hard decisions corresponding to the first component code word and to the soft reliability measures that were assigned to the shared bits responsively to decoding the second component code word;

decoding the remaining components of the code word, to recover the original data; and outputting the recovered original data from the soft decoder, following the decoding, wherein decoding the first component code word is performed based on: (i) the channel hard decisions received for the bits other than the shared bits, and (ii) the soft reliability measures received for the shared bits, and wherein the decoding reduces the latency and power consumption of the decoder.

20. The computer-readable medium according to claim 19, wherein receiving the channel hard decisions comprises retrieving the GLDPC code word from a memory device.

* * * * *